(12) United States Patent
Brockhaus et al.

(10) Patent No.: US 10,784,884 B2
(45) Date of Patent: Sep. 22, 2020

(54) FIELD MEASURING DEVICE

(71) Applicant: KROHNE Messtechnik GmbH, Duisburg (DE)

(72) Inventors: Helmut Brockhaus, Oberhausen (DE); Steffen Dymek, Oberhausen (DE); Manuel Fischnaller, Bochum (DE)

(73) Assignee: KROHNE Messtechnik GmbH, Duisburg (DE)

( * ) Notice: Subject to any disclaimer, the term of this patent is extended or adjusted under 35 U.S.C. 154(b) by 0 days.

(21) Appl. No.: 16/541,759

(22) Filed: Aug. 15, 2019

(65) Prior Publication Data
US 2020/0136641 A1    Apr. 30, 2020

(30) Foreign Application Priority Data

Oct. 26, 2018  (DE) .................. 10 2018 126 808

(51) Int. Cl.
  *H03M 1/50*  (2006.01)
  *H03M 1/06*  (2006.01)
  *H03M 1/40*  (2006.01)

(52) U.S. Cl.
  CPC ......... *H03M 1/504* (2013.01); *H03M 1/0612* (2013.01); *H03M 1/406* (2013.01)

(58) Field of Classification Search
  CPC .... H03M 1/504; H03M 1/0612; H03M 1/406; G08C 19/02; G01D 21/00
  USPC ................................................ 341/157, 155
  See application file for complete search history.

(56) References Cited

U.S. PATENT DOCUMENTS

| | | | | |
|---|---|---|---|---|
| 10,569,301 | B2* | 2/2020 | Lei ..................... | B06B 1/045 |
| 10,605,004 | B1* | 3/2020 | Brunner ............... | H01Q 1/523 |
| 10,630,001 | B1* | 4/2020 | Vella ................... | H01L 27/28 |
| 2009/0271558 | A1 | 10/2009 | Wormmeester et al. | |

FOREIGN PATENT DOCUMENTS

| | | | |
|---|---|---|---|
| DE |     3934007 | A1 | 10/1990 |
| DE |    10161072 | A1 | 6/2003 |
| DE | 102013100799 | A1 | 6/2014 |
| DE | 102016207289 | B3 | 5/2017 |

* cited by examiner

*Primary Examiner* — Brian K Young
(74) *Attorney, Agent, or Firm* — Whitmyer IP Group LLC

(57) ABSTRACT

A field measuring device includes a sensor, a measuring transducer, and interface electronics. The interface electronics include a measuring and control device, and first and second terminals for connecting an external electrical device. A current controller and a current measuring device are connected in series in a terminal current path between the first and second terminals. The interface electronics has a voltage source that can be switched on in the terminal current path and disconnected from the terminal current path, so that the voltage source can drive a current in the terminal current path in the switched-on state and in the case of a connected external electrical device. The measuring and control device actuates and reads the current controller, the current measuring device, and the voltage source such that a current signal is output or input via the first and second terminals when an external device is connected.

15 Claims, 9 Drawing Sheets

FIELD MEASURING DEVICE

TECHNICAL FIELD

The invention relates to a field measuring device comprising a sensor, a transducer and interface electronics, wherein the interface electronics have a measuring and control device and at least one first terminal and one second terminal for connecting an external electrical device.

BACKGROUND

Field measuring devices of the type described have been used for decades in process and automation engineering, where they are used for the metrological monitoring of a technical process, for example an industrial production process. Like field devices in general, field measuring devices are located "in the field", i.e. in the immediate process environment outside of switch cabinets or control rooms. They are therefore often exposed to comparatively harsh environmental conditions and usually have a correspondingly robust design.

The sensor of the field measuring device delivers a raw measured value that reflects the measured variable of interest. The measured variable of interest can be any measured variable, such as volume or mass flow, temperature, pressure, electrical voltages or mechanical tensions, pH value, viscosity or density of a medium, level of a container, etc.; the measured variable of specific interest is irrelevant here. The raw measured value is further processed by the transmitter and converted into an output variable that can be better processed usually electrical. Essentially, it is possible for the field measuring device to exchange information with an external electrical device such as a control room via the interface electronics connected to it.

Some descriptions of the state of the art assign the previously described functionality entirely the term "measuring transducer". Devices that register, convert, and make a measured value available externally in a suitable form via an interface are technically referred to as transmitters.

In order to be able to connect an external electrical device to the field measuring device, the field measuring device or the interface electronics has at least two terminals. These can be, for example, the terminals of a two-wire interface, by means of which a 4-20 mA current loop is implemented. Internal data of the field measuring device, such as the measured value, can be transmitted to a connected external electrical device via the interface electronics. The interface electronics can also be used to receive data from a connected external electrical device, which is then evaluated by the interface electronics. This information can be used, for example, to configure the field measuring device. There are field measuring devices in which the interface electronics is designed as an analog interface, i.e. to output or receive an analog electrical signal, which includes, for example, the 4-20 mA current interface already mentioned. However, the interface electronics can also be implemented to output or receive information in a digital technology. These include, for example, HART interfaces and pulse and/or frequency interfaces.

The multitude of different options for functionally assigning the interface of a field measuring device (input, output, analog, digital/binary, type of electrical quantity, passive, active) is often achieved by alternative hardware equipment. The field measuring device of a particular type and series can then be equipped with different interface options that are mutually exclusive. It is also possible that a field measuring device of a certain series has a uniform basic electronics, i.e. a uniform sensor and a uniform transmitter, but then if desired a corresponding interface electronics is integrated modularly into the uniform basic electronics before delivery of the device, for example by plugging a board with the special interface electronics onto a basic board with the uniform basic electronics.

SUMMARY

All in all, the procedures described for the implementation of various interface options are very complex and not very flexible. The object of the invention is therefore to provide a field measuring device that avoids the disadvantages described above.

The above described object is achieved with the field measuring device described in the introduction in that a current controller and a current measuring device are connected in series in a terminal current path between the first terminal and the second terminal in the interface electronics. In addition, it is provided that the interface electronics has a voltage source and that the voltage source can be switched on in the terminal current path and disconnected from the terminal current path so that the voltage source can drive a current in the terminal current path in the switched-on state in the terminal current path and in the case of a connected external electrical device. In addition, the interface electronics also provides that the measuring and control device actuates and reads the current controller, the current measuring device and the voltage source in such a way that optionally an analog current signal or a binary current signal is output or input via the first terminal and the second terminal when an external device is connected.

Due to the special design of the interface electronics, the field measuring device described above makes it possible to implement four different interface functionalities, namely the output of an analog current signal, the output of a binary current signal, the reading of an analog current signal and the reading of a binary current signal. The interface electronics is therefore extremely flexible and there is no need to implement or maintain various hardware variations for the field measuring device or the interface electronics.

It is possible to control the current in the terminal current path via the current controller in the terminal current path. The voltage source that can be switched on in the terminal current path and disconnected from the terminal current path enables the field measuring device to actively drive a current in the terminal current path as required, provided that an external device is connected to the first terminal and the second terminal. The external device itself, then, does not itself drive current in the current loop it forms with the field device. The voltage source in the field device does not have to be permanently switched on in the terminal current path, the voltage source must at least be functionally able to be switched on in the terminal current path in case current is driven in the terminal current path by the voltage source.

For example, the voltage source could be electrically disconnected from the terminal current path by means of a switching device with which the voltage source can practically be switched on and off by the measuring and control device.

With regard to the implementation of an analog current input, a preferred design of the field measuring device according to the invention is characterized in that the current measuring device in the terminal current path registers the actual value $I_{ist}$ of the current in the terminal current path. Preferably, the current measuring device for registering the current in the terminal current path is implemented as an electrical resistor, preferably as an ohmic electrical resistor. The voltage drop across the resistor is then evaluated by the measuring and control device as a measure for the current in the terminal current path. Preferably, the voltage drop is converted into a corresponding digital data value by an analog-to-digital converter and digitally processed. Of course, the analog value of the voltage drop can also be registered and processed by the measuring and control device.

In order to implement the reading of an analog current signal, it is further provided that for the measurement of the analog current signal especially if it is driven externally, i.e. by a connected external device the current controller and the voltage source are deactivated by the measuring and control device. These measures ensure that a current driven into the terminal current path from an external source via the first terminal and the second terminal of the interface electronics remains as unaffected and undistorted as possible. The term "deactivated" should also be understood in this sense. If, for example, the current controller is implemented as an adjustable electrical resistor in the terminal current path, then the current controller is deactivated by setting it as high as possible. The current controller could also be functionally deactivated by electrically bypassing it in the terminal current path and thus having practically no effect.

If a current is externally driven from the terminals of the interface electronics into the terminal current path, influencing the voltage source is undesirable. The voltage source could therefore be deactivated by the measuring and control device by electrically disconnecting the voltage source from the terminal current path using a switching device, so that no current can be driven in the terminal current path by the voltage source.

With regard to the implementation of the output of a current signal, in particular an analog current signal, it is provided in a preferred configuration that the current controller, as an actuator, has a controllable electrical resistor, in particular based on a semiconductor, in the terminal current path. It is obvious that the current flow in the terminal current path can be influenced by varying the resistance value of the electrical resistor. For this, an actual value $I_{ist}$ is registered for the current in the terminal current path, wherein this actual value is provided, in particular, by the current measuring device. The actual value $I_{ist}$ is compared to a specified setpoint value $I_{soll}$ for the current in the terminal current path. The controllable electrical resistor is then controlled in such a way that the setting difference between the setpoint value $I_{soll}$ and the actual value $I_{ist}$ for the current in the terminal current path is reduced, in particular to zero.

The controllable electrical resistor can be a transistor, preferably a bipolar transistor, but especially a field effect transistor, since transistors of the latter group have a lower temperature dependence (this applies in particular to MOS-FET). In order to register the setting difference and to drive the transistor, an operation amplifier is preferably used, wherein the output of the operation amplifier drives the control electrode of the transistor being used (basis of the bipolar transistor, gate of the field effect transistor). The default value for the current in the terminal current path, i.e. the setpoint $I_{soll}$, is at least indirectly specified by the measuring and control device in the form of a voltage and applied to a positive input of the operational amplifier. The actual value $I_{ist}$ of the current is supplied back to the negative input of the operational amplifier in the form of an electrical voltage. In this way, the claimed current controller can be implemented as an example.

In a preferred design of the field measuring device, the current controller and the voltage source are activated by the measuring and control device in order to actively set an analog current signal. By activating the current controller and voltage source, it is basically possible to imprint a current into the terminal current path. The voltage source can be activated in various ways. In analogy to what was previously done to deactivate the voltage source, the activation of the voltage source can mean, for example, that it is switched into the terminal current path by means of a switching device.

In another preferred design of the field measuring device, it is provided that for passive setting of an analog current signal, the current controller is activated by the measuring and control device and the voltage source is deactivated. The current through the terminal current path is driven from the outside, i.e. by an external electrical device connected to the terminals. The field measuring device itself therefore does not drive the current actively, but only adjusts its size in the terminal current path.

In a preferred configuration of the field measuring device, it is provided that the interface electronics has a current conducting device which, for the active setting of the analog or binary current signal, implements a series connection of the voltage source, the connected external device, the current controller and the current measuring device and which, for the passive setting of the analog or binary current signal, implements a series connection of the connected external device, the current controller and the current measuring device. For clarification, it is important to note that any external device that may be connected is not part of the field measuring device. However, if the external device is connected, the described configuration and function is achieved.

A preferred further development of the field measuring device is characterized in that the current conducting device comprises a switch and a bridge circuit, in particular wherein the switch is electrically arranged between the first terminal or the second terminal and a first terminal of the bridge circuit and wherein the second terminal or the first terminal is electrically connected to a second terminal of the bridge circuit opposite the first terminal of the bridge circuit. Preferably, then, a third terminal of the bridge circuit is connected to the device ground (like other circuit parts also) and a fourth terminal of the bridge circuit opposite the third terminal of the bridge circuit is connected to the current controller or the current measuring device.

In a further design of the field measuring device, it is provided that the binary current signal is generated by the measuring and control device in that only two possible setpoint values, namely a low setpoint value $I_{soll, low}$ and a high setpoint value $I_{soll, high}$ are provided to the current controller as possible setpoint values $I_{soll}$ for the current in the terminal current path, wherein the two setpoint values represent the two values of the binary current signal. If the current controller expects a voltage signal as a default value, the voltages for the low setpoint $I_{soll, low}$ and the high setpoint $I_{soll, high}$ could be set by the measuring and control device using a digital-to-analog converter which, for example, is provided in a microcontroller itself or which could be designed as a stand-alone electronic component. With this solution, it must be taken into account that, due to the conversion time required when using a D/A converter, time restrictions can be expected when switching between the binary values.

For the aforementioned reason, it is provided in a preferred development of the field measuring device that the high setpoint $I_{soll,\ high}$ for the binary current signal is generated in the measuring and control device as a high voltage signal on a supply line to the current controller. It is further provided that the low setpoint $I_{soll,\ low}$ for the binary current signal is generated in the measuring and control device as a low-voltage signal, wherein the supply line to the current controller is drawn from the high-voltage signal to the low-voltage signal by closing a semiconductor switch. In this solution, the two voltage values are generated by the circuitry and the current controller can be switched from the high setpoint to the low setpoint and vice versa much faster than is possible with the solution addressed using a D/A converter. This allows for a D/A converter to be omitted.

The reading of a binary current signal is implemented in a preferred design of the field measuring device in that the actual value $I_{ist}$ of the current in the terminal current path registered by the current measuring device in the terminal current path is smoothed by means of a low-pass filter and, in particular, is amplified by means of an amplifier. The smoothed and in particular amplified actual value $I_{ist}$ is then supplied to a comparator and/or to the analog input of a microcontroller of the measuring and control device for evaluation. This makes it possible to evaluate the binary current signal in an analog and digital manner. The comparator is selected so that it switches in the terminal current path at a specified threshold for the current, which is why it implements a digital interface. The output signal supplied by the mass comparator can then be supplied to a digital input of a microcontroller of the measuring and control device for further evaluation.

BRIEF DESCRIPTION OF THE DRAWINGS

In detail, there are now various possibilities for designing and further developing the field measuring device according to the invention. For this, reference is made to the following description of embodiments in conjunction with the drawings.

DETAILED DESCRIPTION

Figure 1:
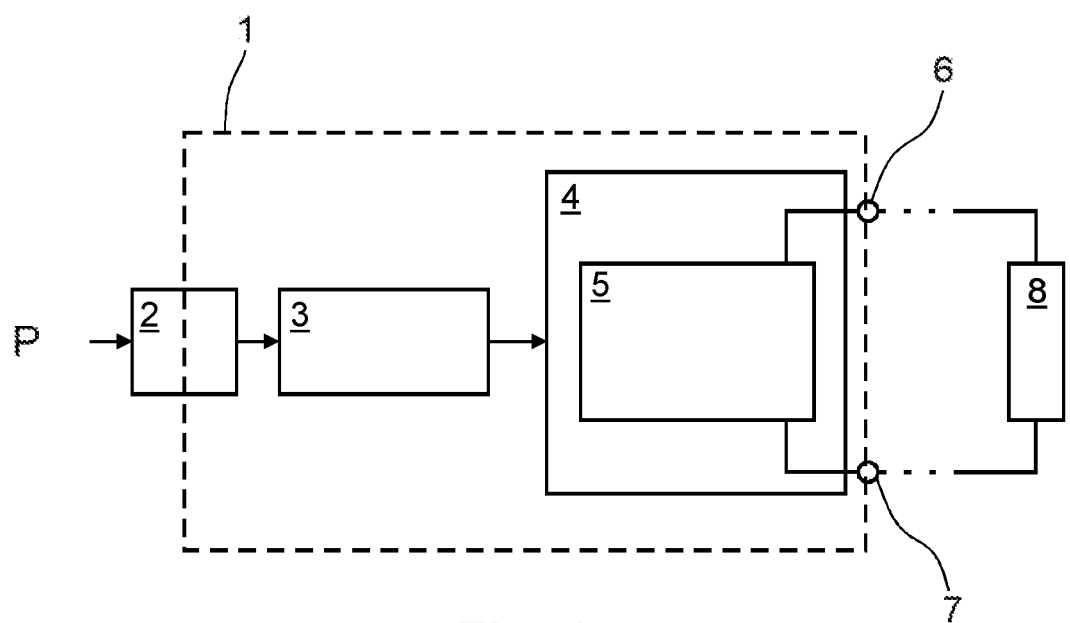
FIG. 1 illustrates a field measuring device as it is known from the state of the art.

FIG. 1 shows a field measuring device 1 as it is known from the state of the art. The field measuring device 1 has a sensor 2, a measuring transducer 3 and interface electronics 4. The sensor 2 usually registers information about a technical process P, for example a medium temperature or a filling level. The sensor 2 supplies a raw measuring signal which is further processed by the measuring transducer 3 and made accessible to interface electronics 4 in a suitable form. For example, the measuring transducer 3 can be designed for high-resistance detection of the raw measuring signal of the sensor 2 and then for amplification of it and possibly for providing it smoothed i.e. generally signal processed to the interface electronics 4. The function implemented in the measuring transducer 3 in detail is irrelevant here.

The interface electronics 4, in turn, has a measuring and control device 5 and at least a first terminal 6 and a second terminal 7. The terminals 6, 7 are used to connect an external electrical device 8. Basically, the terminals 6, 7 are used to exchange information with the external electrical device 8—for example a control room. For this, either current signals from the field measuring device 1 can be output or also received via the terminals 6, 7. Depending on the design of the field measuring device 1, an analog current signal is output or received or a binary current signal is output or received via the terminals 6, 7. The various options for designing the interface electronics 4 are often implemented in the state of the art as alternatives and in the form of various mutually exclusive hardware variations.

The measuring and control device 5 can be composed of several components, for example a microcontroller and various electrical/electronic elements, with which the electrical path between the first terminal 6 and the second terminal 7 can be directly influenced.

Figure 2:
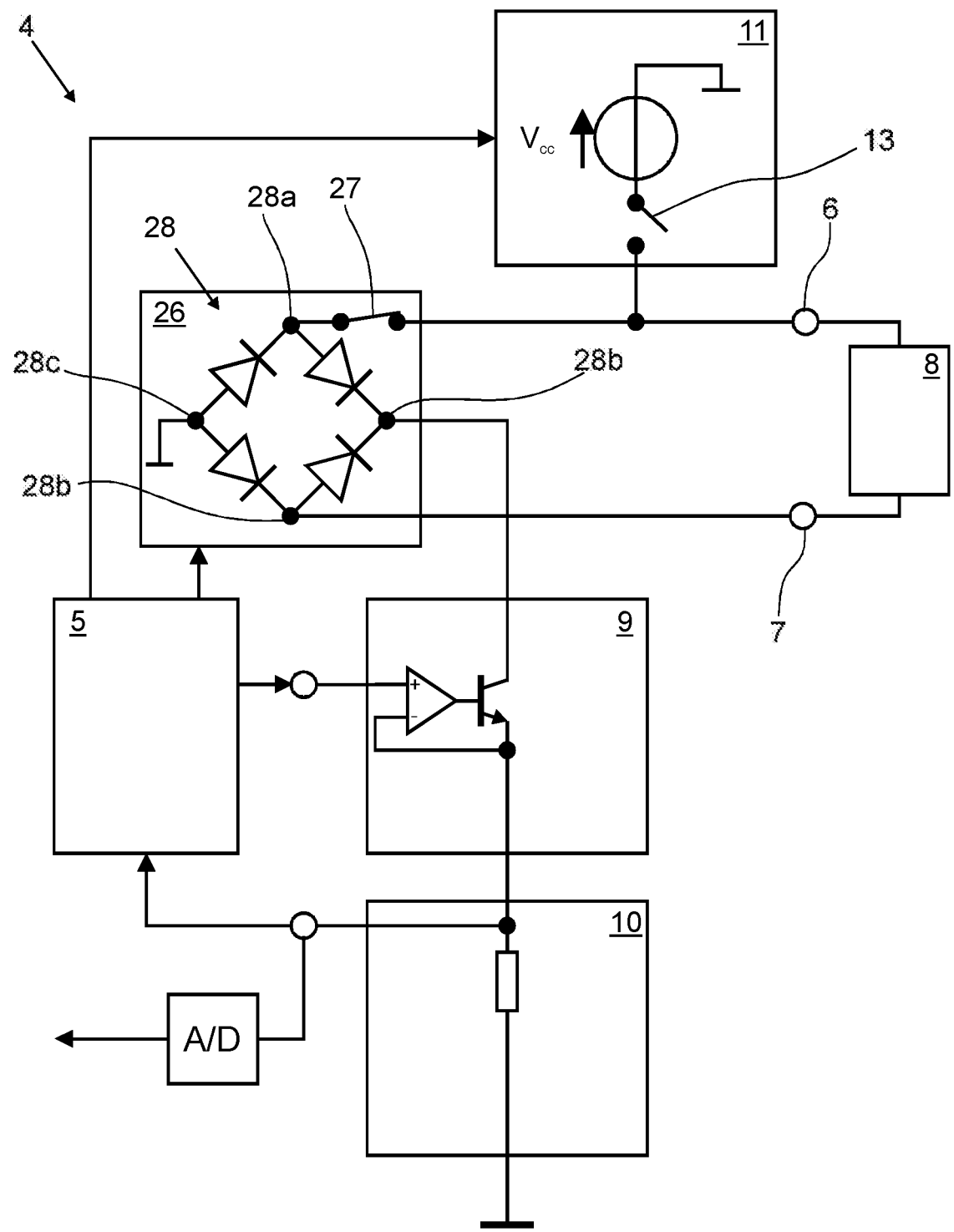
FIG. 2 illustrates the interface electronics of a field measuring device according to the invention.

FIG. 2 only shows the interface electronics 4. The interface electronics 4 is characterized in that a current controller 9 and a current measuring device 10 are connected in series in a terminal current path between the first terminal 6 and the second terminal 7. In the example shown, this is done indirectly via a current conducting device 26. The electrical connection between the first terminal 6 via the current controller 9 and the current measuring device 10 up to the second terminal 7 is thus referred to as the terminal current path.

The interface electronics 4 also has a voltage source 11, wherein the voltage source 11 can be switched on in the terminal current path and disconnected from the terminal current path, so that the voltage source 11 can drive a current in the terminal current path when switched on in the terminal current path and in the case of a connected external electrical device 8. The interface electronics 4 are designed in such a way that the measuring and control device 5 controls and reads the current controller 9, the current measuring device 10 and the voltage source 11 in such a way that optionally an analog current signal or a binary current signal is output or input via the first terminal 6 and the second terminal 7 when an external device 8 is connected. The configuration shown thus allows a total of four different input and output functions to be implemented with the interface electronics 4, wherein it is also possible to operate the interface electronics 4 both passively and actively with suitable control. Passive operation means that the field measuring device 1 or the interface electronics 4 do not provide any energy of their own, i.e. the field measuring device 1 or the interface electronics 4 work with energy that is provided externally, i.e. by the external electrical device 8. In contrast, the active operation of the interface with the first terminal 6 and the second terminal 7 means that the field measuring device 1 or its interface electronics 4 itself provides energy, for example for driving a current externally via the terminals 6, 7; the energy is provided with the aid of the voltage source 11.

In the following figures, an example is given of how the various variations for output or input of an analog or binary current signal can be implemented.

Figure 3:
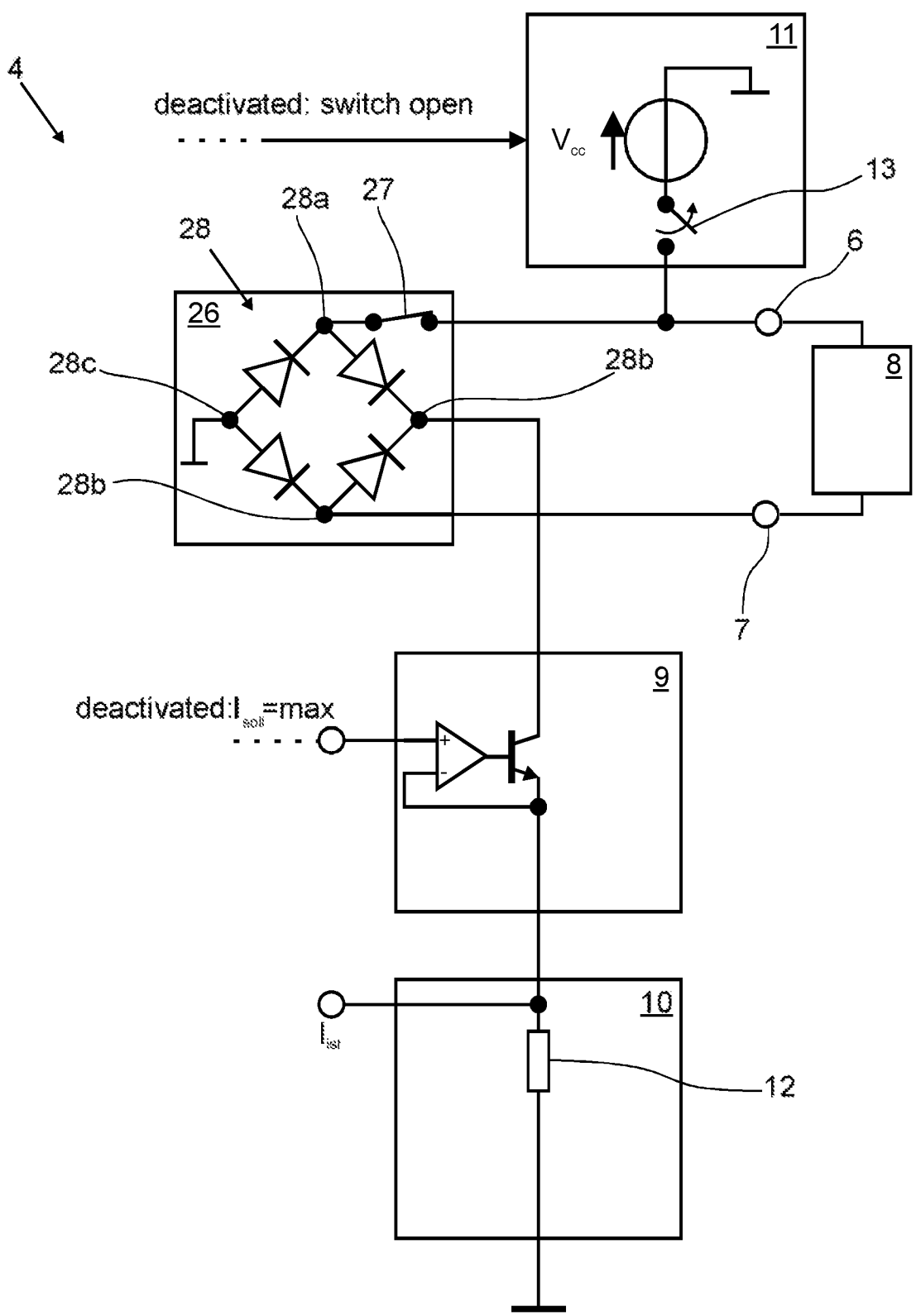
FIG. 3 illustrates an embodiment for the implementation of the reading of an analog current signal.

FIG. 3 shows how, in particular, an analog current signal can be read via the terminal current path between the first terminal 6 and the second terminal 7, in which the current controller 9 and the current measuring device 10 are connected in series at the same time. The current measuring device 10 registers the actual value $I_{ist}$ of the current in the terminal current path, wherein the current measuring device 10 is designed as an electrical resistor 12. The voltage drop across the resistor 12 can then be evaluated as a measure of the current in the terminal current path by the measuring and control device 5. In this case, the electrical resistor 12 is an ohmic resistor, so that there is essentially a proportional relationship between the current through the resistor and the voltage drop across the resistor. This measured actual value $I_{ist}$ of the current in the terminal current path can now be further processed as an analog voltage value or converted into a digitally processable value by means of an analog-to-digital converter, as indicated in FIG. 2.

FIG. 3 also shows that for the measurement of a current signal by the measuring and control device 5, the current controller 9 and the voltage source 11 are deactivated. In the example shown, this means that a switching device 13 of the voltage source 11 is opened to deactivate the voltage source 11 (deactivated: switch open) and that the current controller 9 is set to maximum by giving it a maximum value as the default value $I_{soll}$ for the current in the terminal current path (deactivated: $I_{soll}$=max). When deactivating, the voltage source 11 is electrically disconnected from the terminal current path by means of the switching device 13, so that no current can be driven in the terminal current path by the voltage source 11.

FIG. 3 also shows a current conducting device 26, which comprises a switch 27 and a bridge rectifier 28. In the operating state of reading a current signal considered here, the switch 27 of the current conducting device 26 is closed, so that a series connection of the external device 8, the deactivated current controller 9 and the current measuring device 10 is implemented.

Figure 4:
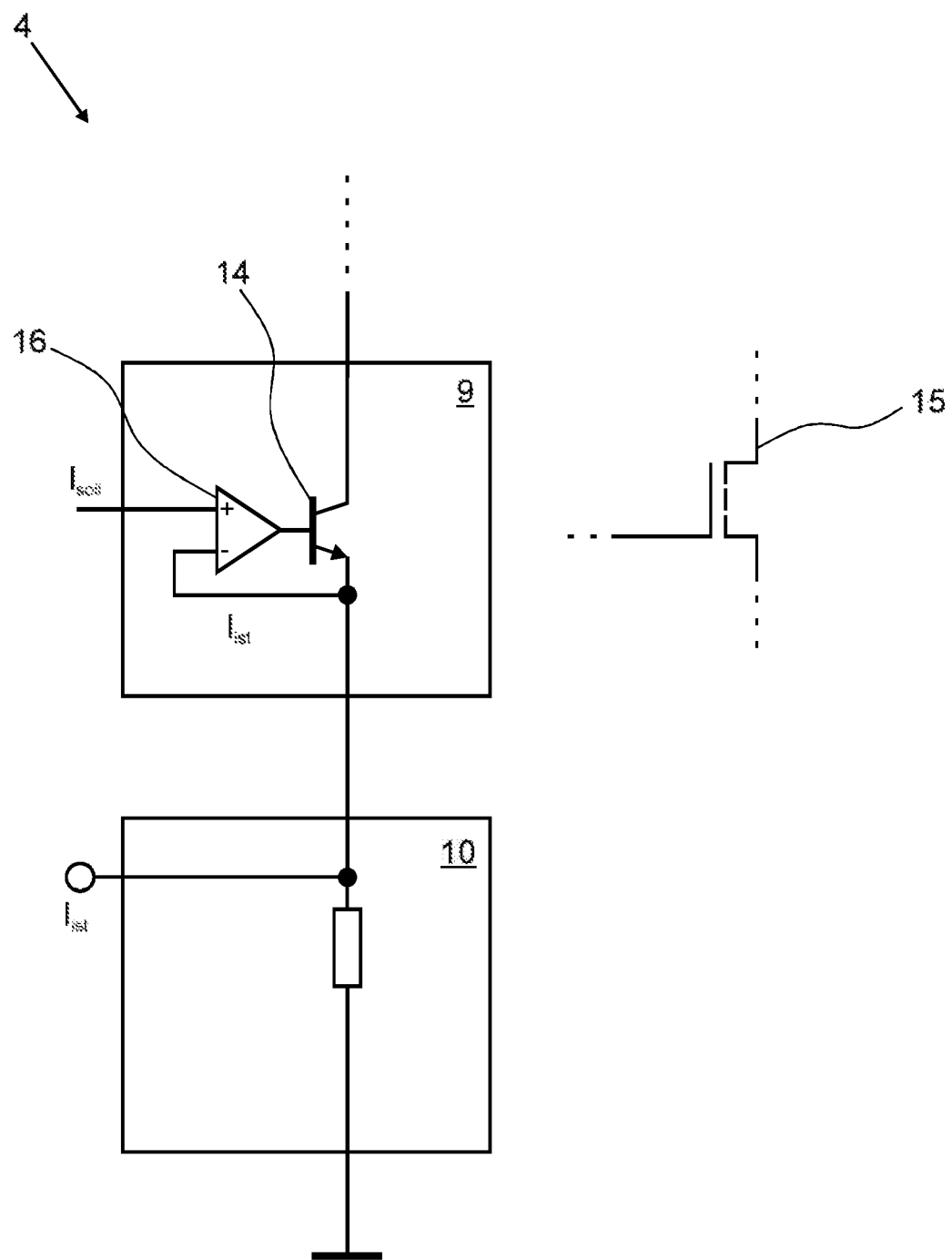
FIG. 4 illustrates an embodiment for the implementation of a current controller.

FIG. 4 shows how a current control is implemented in the field measuring device 1 in the interface electronics 4, with which a setpoint value $I_{soll}$ for the current in the terminal current path can be set. The current controller 9 has a controllable electrical resistor 14 based on semiconductors in the terminal current path as a final control element. In this case, the controllable electrical resistor 14 is a bipolar transistor. In another example, a field effect transistor 15 is used instead of the bipolar transistor 14, as indicated in FIG. 4. The current measuring device 10 registers an actual value $I_{ist}$ for the current in the terminal current path and compares it to a specified setpoint $I_{soll}$ for the current in the terminal path. The controllable electrical resistor 14 is then controlled in such a way that the setting difference between the setpoint value $I_{soll}$ and the actual value $I_{ist}$ for the current in the terminal current path is reduced, preferably to zero. In this case, the setting difference is implemented using an operational amplifier 16, which then drives the control electrode of transistor 14 and varies the resistance over the collector-emitter path until the setting difference reaches zero.

Figure 5:
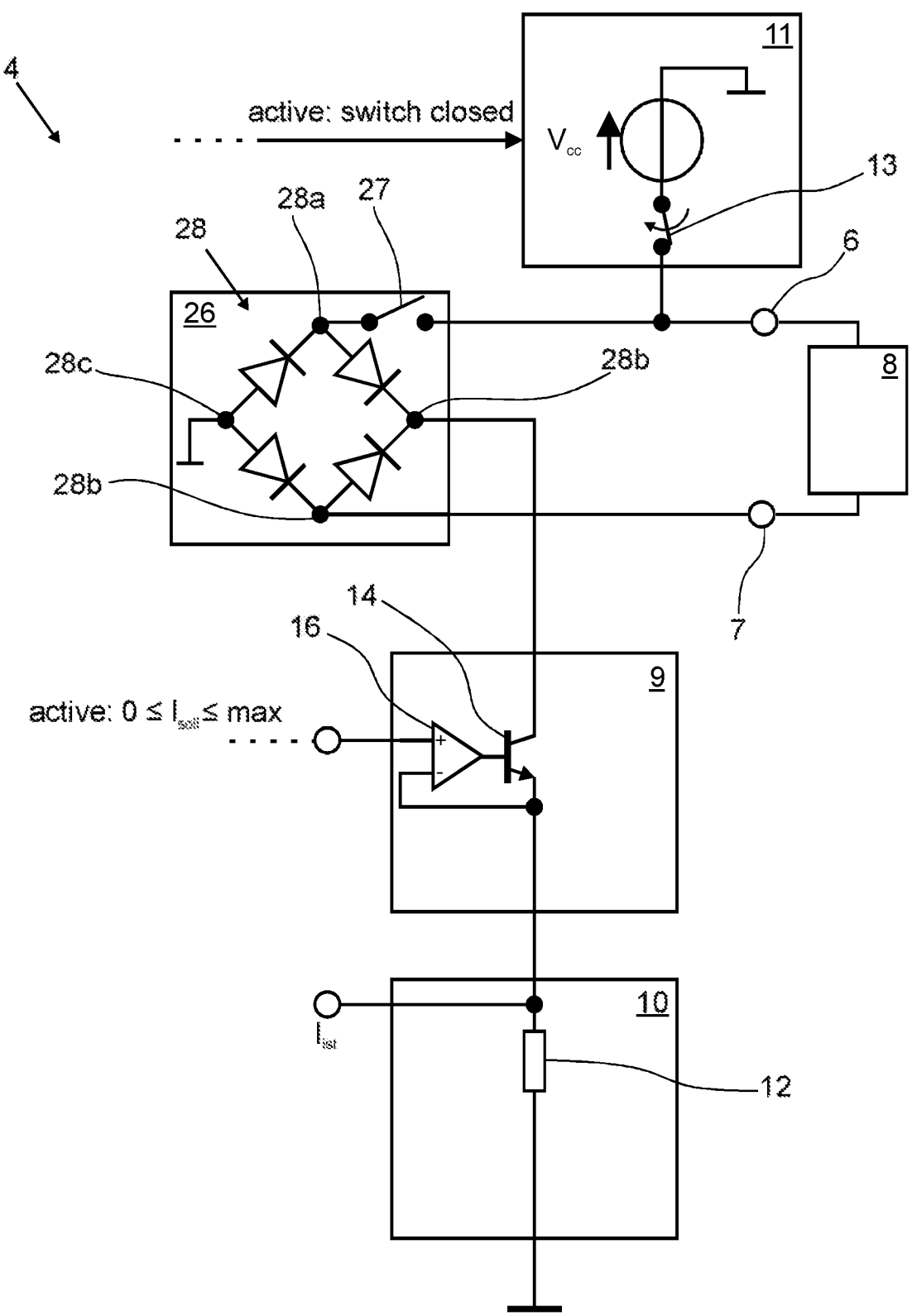
FIG. 5 illustrates an embodiment for the implementation of the active setting of an analog current signal.

FIG. 5 additionally shows that the current controller 9 and the voltage source 11 are activated for the active setting of an analog current signal by the measuring and control device 5. In the example shown, this means that the switch 13 in the voltage source 11 is closed (active: switch closed) and that the current controller 9 is activated in its setting range (active: $0 \leq I_{soll} \leq$max), so that the controllable electrical resistor 14 does not fall into a saturation range. Because the switch 13 of the voltage source 11 is closed, the voltage source 11 can drive a current in the terminal current path.

The current conducting device 26 of the interface electronics 4 establishes a series connection of the voltage source 11, the connected external device 8, the current controller 9 and the current measuring device 10 for the active setting of the analog or binary current signal. Viewed from the voltage source 11, a current is driven via the first terminal 6, the external device 8, the second terminal 7, the second terminal 28b of the bridge rectifier 28, the fourth terminal 28d of the bridge rectifier 28, the current controller 9 and the current measuring device 10, whereby the circuit is then closed via the device ground.

Figure 6:
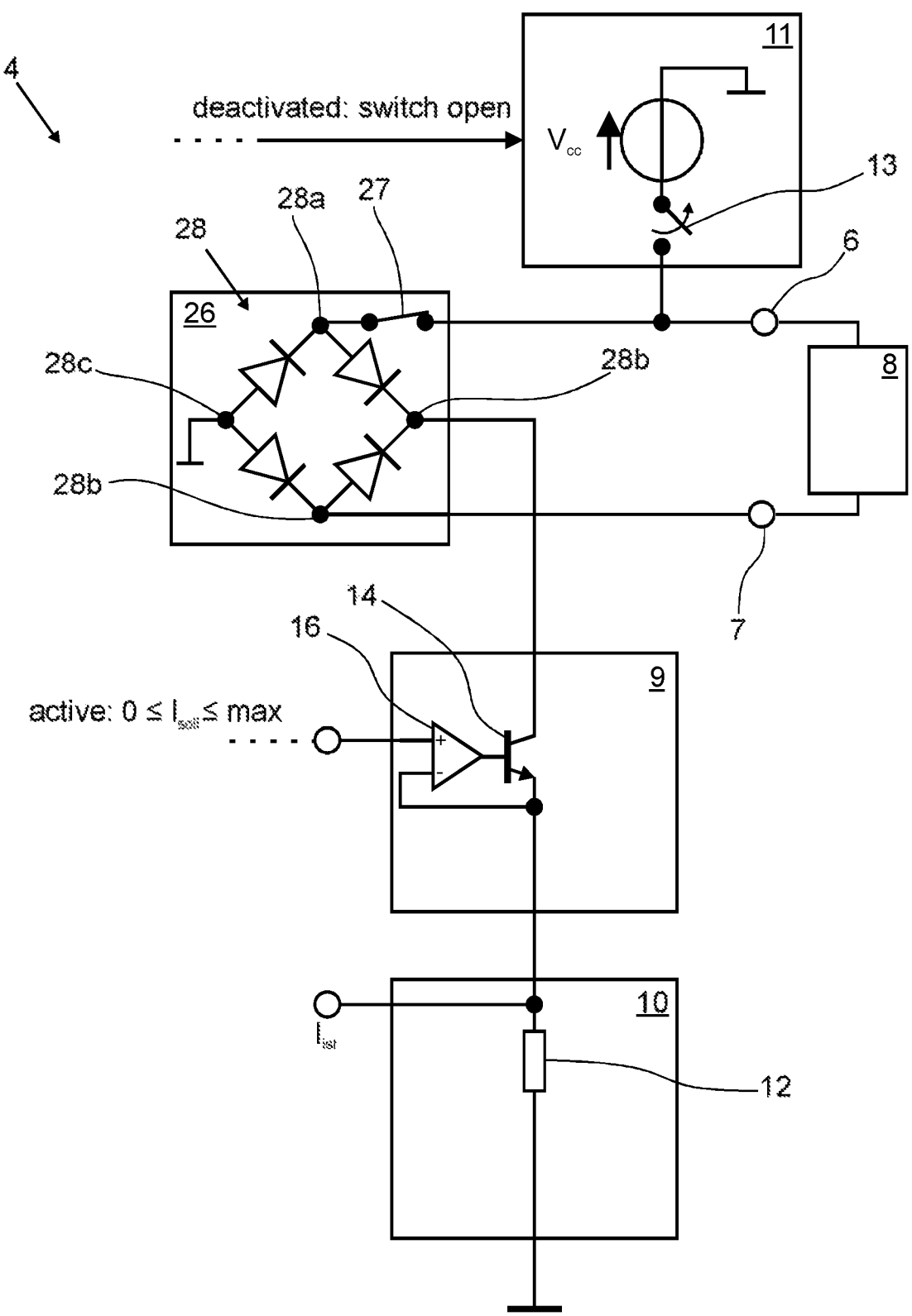
FIG. 6 illustrates an embodiment for the passive setting of an analog current signal.

On the other hand, FIG. 6 shows that for passive setting of an analog current signal in the terminal current path by the measuring and control device 5, the current controller 9 is activated and the voltage source 11 is deactivated. To deactivate the voltage source 11, the switch 13, in turn, is opened. In this case, the voltage source 11 cannot supply any current into the terminal current path, so that the current in the terminal current path is driven solely by an external energy source which is, for example, located in the connected external electrical device 8.

At this point, a comparison of how the current conducting device 26 works presents itself in the case where a current is driven passively i.e. externally in the field measuring device 1, wherein the extent of the current is set in field measuring device 1. To passively adjust the analog or binary current signal, the current conducting device 26 makes a series connection of the connected external device 8, the current controller 9 and the current measuring device 10. In this case, the external device 8 has a voltage source that is not explicitly shown here. Seen from the external device 8, a current is driven via the first terminal 6, the switch 27 of the current conducting device 26, the first terminal 28a of the bridge rectifier 28, the fourth terminal 28d of the bridge rectifier 28, the current controller 9 and the current measuring device 10, via the device ground to the third terminal 28c of the bridge rectifier 28, the second terminal 28b of the bridge rectifier 28 and finally the second terminal 7 of the interface electronics 4 to which the external device 8 is connected. This consideration is based on the idea that the high potential of the voltage source of the external device 8 is present at the first terminal 6.

Due to the current conducting device 26 with the bridge rectifier 28, reverse polarity protection is automatically implemented so that the external device 8 can also be connected to the first terminal 6 and the second terminal 7 with exactly different polarity of its adopted voltage source, without any change in the function of the field measuring device as seen from the outside. Internally, of course, the current path changes through the bridge rectifier 28.

The explanation shows that the switch 27 is opened when the switching device 13 is closed and vice versa.

All the current conducting devices 26 shown have in common that they comprise a switch 27 and a bridge rectifier 28, wherein the switch 27 is electrically arranged between the first terminal 6 (or the second terminal 7) and a first terminal 28a of the bridge rectifier 28 and wherein the second terminal 7 (or the first terminal 6) is electrically connected to a second terminal 28b of the bridge rectifier 28 opposite the first terminal 28a of the bridge rectifier 28. A third terminal 28c of the bridge rectifier 28 is connected to the electrical device ground and a fourth terminal 28d of the bridge rectifier 28 is finally connected to the current controller 9 or the current measuring device 10.

Figure 7:
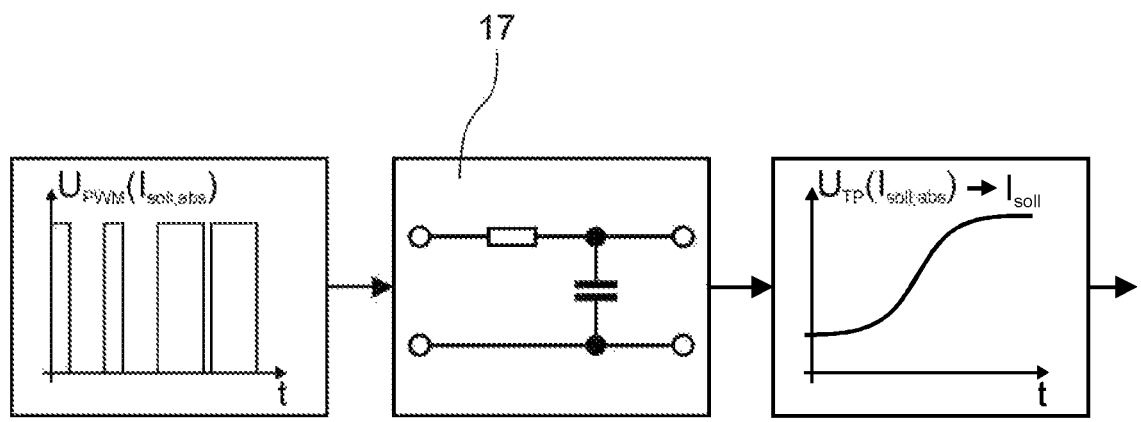
FIG. 7 illustrates an embodiment for setting a current using a pulse width modulated voltage signal.

FIG. 7 shows how the setpoint $I_{soll}$ can be advantageously generated for the current in the terminal current path without having to resort to a digital-to-analog converter. The solution shown here, using a pulse width modulated signal UPWM, is also more cost-effective to implement than using an additional digital-to-analog converter as an external component or by blocking a digital-to-analog converter of a microcontroller, which is usually part of the measurement and control device 5. In any case, FIG. 7 shows that the setpoint $I_{soll}$ for the current in the terminal current path is generated by the measuring and control device 5 as a setpoint voltage by first converting a given abstract setpoint $I_{soll,\ abs}$ for the current into a pulse-width modulated voltage signal UPWM ($I_{soll,\ abs}$). The pulse width modulated voltage signal UPWM is then smoothed using a low pass filter 17 and the smoothed voltage signal UTP is then used directly or indirectly as the setpoint voltage for the current controller 9, wherein this setpoint voltage is the setpoint $I_{soll}$ for the current.

Figure 8:
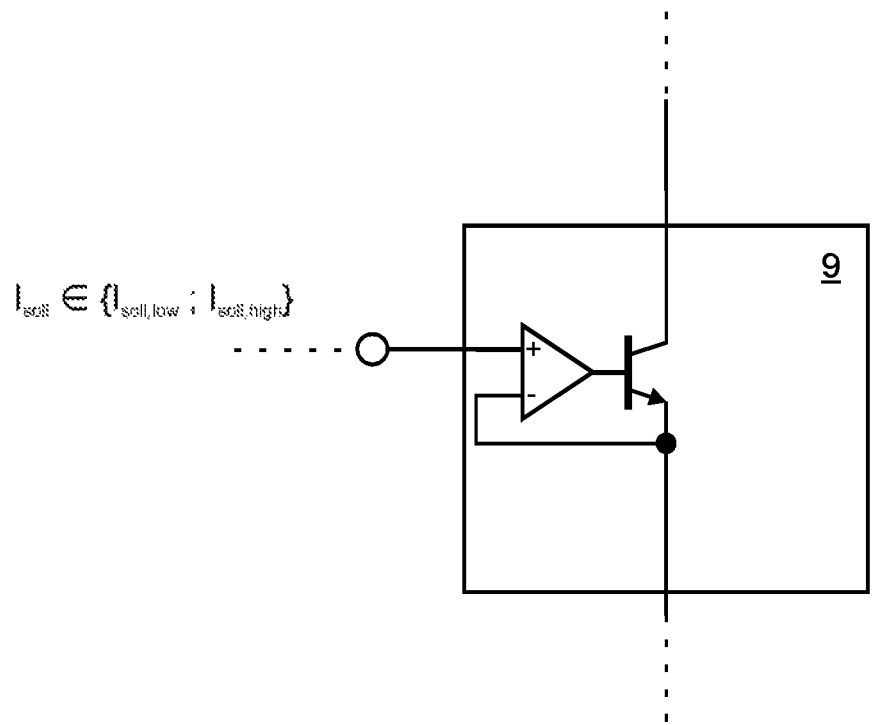
FIG. 8 illustrates an embodiment for generating a binary current signal.

FIG. 8 shows a detail for generating a binary current signal. In the case shown, a binary current signal is generated by giving the current controller 9 only two possible setpoints $I_{soll}$ as possible setpoints $I_{soll}$ for the current in the terminal path from the measuring and control device 5, namely a low setpoint $I_{soll,\ low}$ and a high setpoint $I_{soll,\ high}$, wherein the two setpoints represent the two values of the binary current signal.

Figure 9:
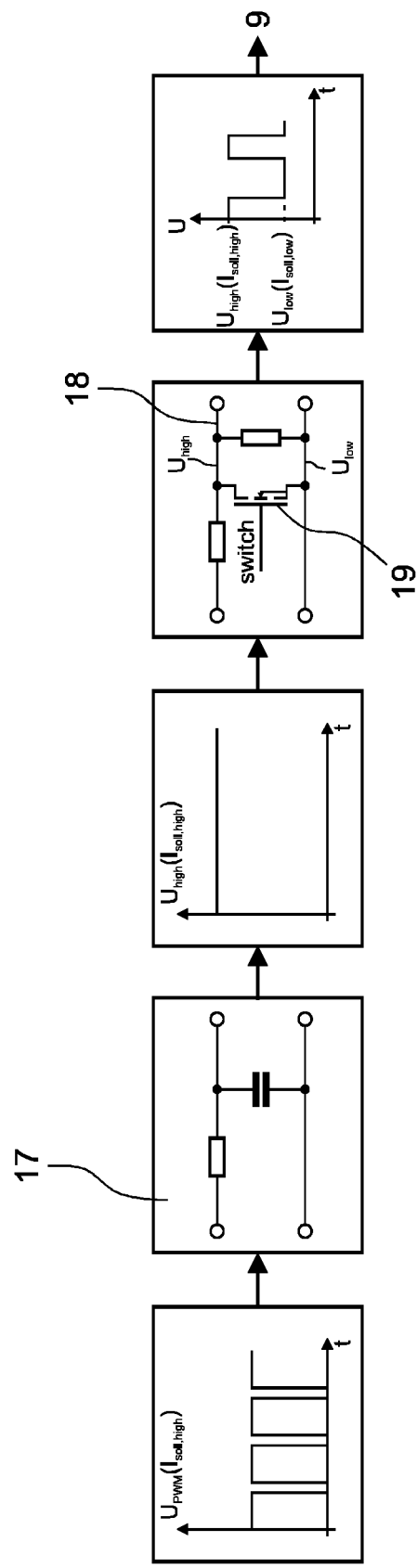
FIG. 9 illustrates a further embodiment for generating a binary current signal.

FIG. 9 now shows how two voltages can be generated in a very effective way, one voltage corresponding to the $I_{soll,\ high}$ setpoint and another voltage corresponding to the $I_{soll,\ low}$ setpoint for the current in the terminal current path. For the implementation shown here, for example, no digital-to-analog converter is necessary, the two binary default voltages $U_{high}$ and $U_{low}$ for the current controller 9 are generated in the circuit, wherein by closing a simple switch 19 between the two voltages $U_{high}$ and $U_{low}$, it is possible to switch back and forth practically without time delay. As a result, the high setpoint $I_{soll,\ high}$ for the binary current signal in the measuring and control device 5 is generated as a high voltage signal $U_{high}$ on a supply line 18 to the current controller 9. Furthermore, the low setpoint $I_{soll,\ low}$ for the binary current signal is also generated in the measuring and control device 5 as the low voltage signal $U_{low}$. The supply line 18 to the current controller 9 is drawn from the high voltage signal $U_{high}$ to the low voltage signal $U_{low}$ by closing a semiconductor switch 19. The second box on the right in FIG. 9 shows that the voltage $U_{high}$ is additionally set by a voltage divider with two ohmic resistors. This measure can be taken to adapt the signal, but it is not absolutely necessary. However, the use of a voltage divider is required in the following situation: For switching between two currents to take place at high speed, the upstream low-pass filter 17 must have the lowest possible output resistance. Thus, an active low-pass filter (using operation amplifiers) is used. If a voltage divider is not used, the output of the operation amplifier would be short-circuited, which of course has to be avoided; in this situation a voltage divider is absolutely necessary. If such a voltage divider is implemented, then the high-voltage signal $U_{high}$ on the input side is not identical with the high-voltage signal $U_{high}$ on the output side of the voltage divider, i.e. on the supply line 18 to the current controller 9. The high-voltage signal on the output side could then also be written as $U'_{high}$. For the expert, it is easy to understand what is meant.

Figure 10:
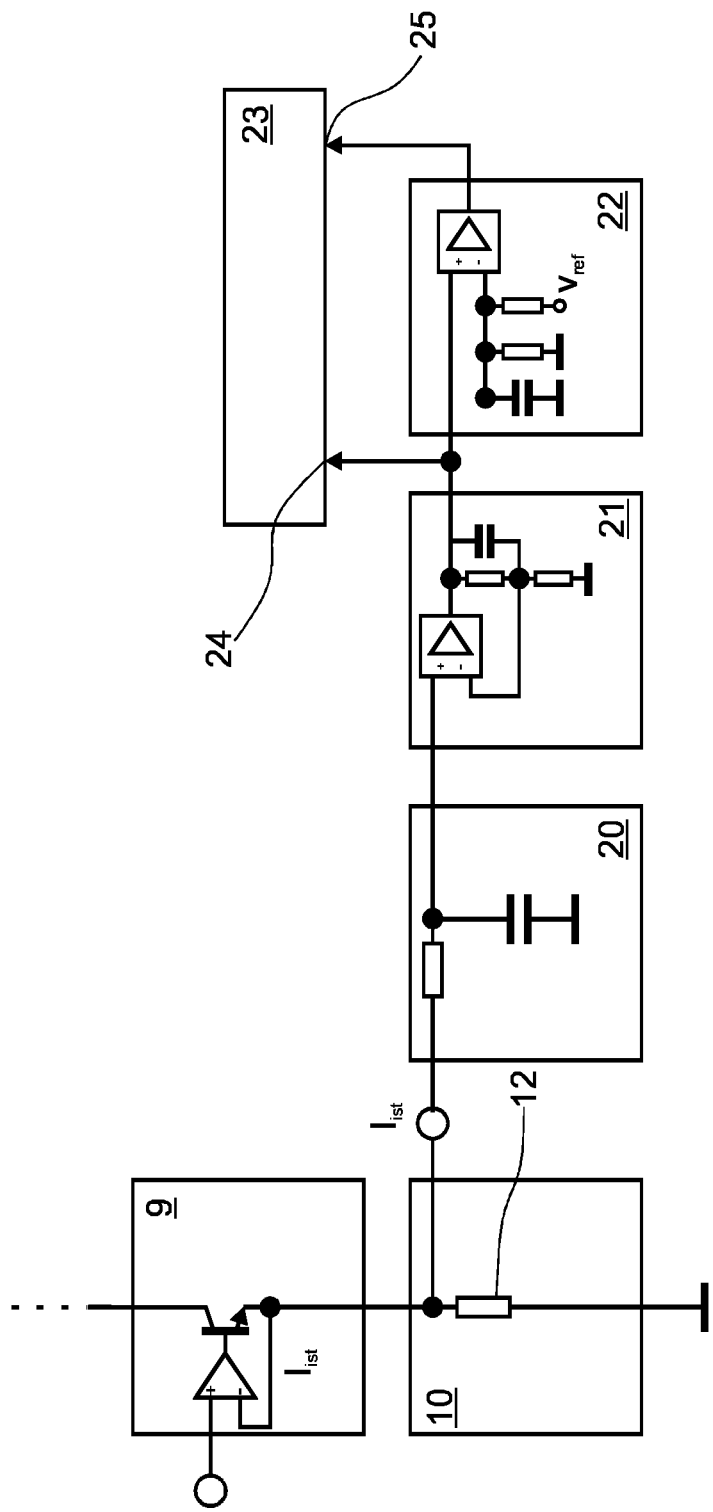
FIG. 10 illustrates an embodiment for reading a binary current signal.

FIG. 10 shows an example of how a binary current signal is read. The current measuring device 10 first registers the actual value $I_{ist}$ of the current registered in the terminal current path. This signal is smoothed using a low-pass filter 20 and amplified using an amplifier 21 if necessary. The smoothed and, in particular, amplified actual value $I_{ist}$ can then be passed on for further evaluation. In FIG. 10 it is supplied directly to the analog input 24 of a microcontroller 23 of the measuring and control device 5. At the same time, however, it is also supplied to a comparator 22 for evaluation, which outputs a binary output signal as a function of a reference voltage and supplies this to the digital input 25 of the microcontroller 23. It goes without saying that the two types of evaluation do not have to be implemented simultaneously, but they can be implemented simultaneously.

The invention claimed is:

1. A field measuring device, comprising:
a sensor;
a measuring transducer;
interface electronics having a measuring and control device and at least one first terminal and one second terminal for connecting an external electrical device,
a current controller and a current measuring device connected in series in a terminal current path between the first terminal and the second terminal in the interface electronics;
wherein the interface electronics has a voltage source that can be switched on in the terminal current path and disconnected from the terminal current path, so that the voltage source can drive a current in the terminal current path in a switched-on state in the terminal current path and in case of a connected external electrical device;
wherein the measuring and control device actuates and reads the current controller, the current measuring device and the voltage source in such a way that optionally an analog current signal or a binary current signal is output or input via the first terminal and the second terminal when an external device is connected.

2. The field measuring device according to claim 1, wherein the current measuring device in the terminal current path is implemented as an electrical ohmic resistor, and a voltage drop across the electrical resistor is evaluated by the measuring and control device as a measure for the current in the terminal current path, wherein the voltage drop is converted by an analog-to-digital converter into a corresponding digital data value and further processed digitally.

3. The field measuring device according to claim 2, wherein the current controller and the voltage source are deactivated for the measurement of an analog current signal by the measuring and control device.

4. The field measuring device according to claim 1, wherein the current controller has, as an actuator, a controllable electrical resistor based on semiconductors, in the terminal current path, wherein, from the current measuring device, an actual value $I_{ist}$ for the current in the terminal current path is registered and compared with a predetermined setpoint value $I_{soll}$ for the current in the terminal current path, and the controllable electrical resistor is actuated in such a way that a control difference between the setpoint value $I_{soll}$ and the actual value $I_{ist}$ for the current in the terminal current path is reduced, is regulated to zero.

5. The field measuring device according to claim 1, wherein for an active setting of the analog or binary current signal, the current controller and the voltage source are activated by the measuring and control device.

6. The field measuring device according to claim 1, wherein, for passive setting of the analog or binary current signal, the current controller is activated and the voltage source is deactivated by the measuring and control device.

7. The field measuring device according to claim 1, wherein the current controller is deactivated by the measuring and control device by being set at maximum or by being bypassed in the terminal current path.

8. The field measuring device according to claim 1, wherein the voltage source is deactivated by the measuring and control device by being electrically disconnected from the terminal current path by means of a switching device, so that no current is driven in the terminal current path by the voltage source.

9. The field measuring device according to claim 5, wherein the interface electronics has a current conducting device which, for the active setting of the analog or binary current signal, implements a series connection of the voltage source, the connected external device, the current controller and the current measuring device, and which, for a passive setting of the analog or binary current signal, implements a series connection of the connected external device, the current controller and the current measuring device.

10. The field measuring device according to claim 9, wherein the current conducting device comprises a switch and a bridge rectifier, wherein the switch is electrically arranged between the first terminal or the second terminal and a first terminal of the bridge rectifier and wherein the second terminal or the first terminal is electrically connected to a second terminal of the bridge rectifier opposite the first terminal of the bridge rectifier.

11. The field measuring device according to claim 4, wherein the setpoint value $I_{soll}$ for the current in the terminal current path is generated by the measuring and control device as a setpoint voltage in that a predetermined abstract setpoint value $I_{soll,\,abs}$ for the current is converted into a pulse-width-modulated voltage signal $U_{PWM}$, the pulse-width-modulated voltage signal $U_{PWM}$ is smoothed by means of a low-pass filter and a smoothed voltage signal $U_{TP}$ is used indirectly or directly as setpoint voltage which represents the setpoint value $I_{soll}$ for the current.

12. The field measuring device according to claim 1, wherein the binary current signal is generated by the measuring and control device in that only two possible setpoint values, namely a low setpoint value $I_{soll,low}$ and a high setpoint value $I_{soll,\,high}$, are provided to the current controller as possible setpoint values $I_{soll}$ for the current in the terminal current path, wherein the two setpoint values represent the two values of the binary current signal.

13. The field measuring device according to claim 12, wherein the high setpoint value $I_{soll,\,high}$ for the binary current signal in the measuring and control device is generated as a high-voltage signal $U_{high}(I_{soll,\,high})$ on a supply line to the current controller, that the low setpoint value $I_{soll,\,low}$ for the binary current signal in the measuring and control device is generated as a low-voltage signal $U_{low}(I_{soll,\,low})$, and in that the supply line to the current controller is drawn from the high-voltage signal $U_{high}$ to the low-voltage signal $U_{low}$ by closing a semiconductor switch.

14. The field measuring device according to claim 1, wherein the binary current signal is input, in that the actual value $I_{ist}$ of the current in the terminal current path registered by the current measuring device in the terminal current path is smoothed by means of a low-pass filter and amplified by means of an amplifier and the smoothed and amplified actual value $I_{ist}$ is supplied to a comparator and/or to an analog input of a microcontroller of the measuring and control device for evaluation.

15. The field measuring device according to claim 14, wherein the output signal supplied by the comparator is supplied to the digital input of the microcontroller of the measuring and control device for further evaluation.

* * * * *